United States Patent
Kang et al.

(10) Patent No.: US 12,484,438 B2
(45) Date of Patent: Nov. 25, 2025

(54) OCNN-TYPE TETRADENTATE PLATINUM (II) COMPLEX, PREPARATION METHOD THEREFOR, AND APPLICATION THEREOF

(71) Applicant: GUANGDONG AGLAIA OPTOELECTRONIC MATERIALS CO., LTD, Guangdong (CN)

(72) Inventors: Jian Kang, Foshan (CN); Lei Dai, Foshan (CN); Lifei Cai, Foshan (CN)

(73) Assignee: GUANGDONG AGLAIA OPTOELECTRONIC MATERIALS CO., LTD., Foshan (CN)

( * ) Notice: Subject to any disclaimer, the term of this patent is extended or adjusted under 35 U.S.C. 154(b) by 722 days.

(21) Appl. No.: 17/776,978

(22) PCT Filed: Sep. 19, 2020

(86) PCT No.: PCT/CN2020/116339
§ 371 (c)(1),
(2) Date: May 13, 2022

(87) PCT Pub. No.: WO2021/128982
PCT Pub. Date: Jul. 1, 2021

(65) Prior Publication Data
US 2022/0416180 A1   Dec. 29, 2022

(30) Foreign Application Priority Data
Dec. 24, 2019   (CN) .......................... 201911343671.7

(51) Int. Cl.
| C07D 401/14 | (2006.01) |
| C07F 15/00 | (2006.01) |
| C09K 11/06 | (2006.01) |
| H10K 85/30 | (2023.01) |
| H10K 50/11 | (2023.01) |
| H10K 101/10 | (2023.01) |

(52) U.S. Cl.
CPC ......... *H10K 85/346* (2023.02); *C07D 401/14* (2013.01); *C07F 15/0086* (2013.01); *C09K 11/06* (2013.01); *C09K 2211/1059* (2013.01); *C09K 2211/185* (2013.01); *H10K 50/11* (2023.02); *H10K 2101/10* (2023.02)

(58) Field of Classification Search
CPC .............. C07D 401/14; H10K 85/346
See application file for complete search history.

(56) References Cited

U.S. PATENT DOCUMENTS
2015/0162552 A1   6/2015  Li et al.
2016/0359125 A1   12/2016  Li et al.

FOREIGN PATENT DOCUMENTS
| CN | 105418591 A | 3/2016 |
| CN | 106939024 A | 7/2017 |
| CN | 108276450 A | 7/2018 |
| CN | 109970714 A | 7/2019 |
| CN | 109980111 A | 7/2019 |

*Primary Examiner* — Paul V Ward
(74) *Attorney, Agent, or Firm* — Maschoff Brennan

(57) ABSTRACT

An O∧C∧N∧N tetradentate platinum (II) complex has a structure as shown in Formula (I) below. Compared with a conventional devices, the organic light-emitting device prepared as described herein has better performance. The novel O∧C∧N∧N tetradentate platinum (II) complex has great application value. The tetradentate platinum (II) complex is based on a carbazole framework, and has a large π-conjugated rigid planar structure, which can greatly reduce non-radiative energy dissipation such as intramolecular rotation and vibration, and is conducive to improving the luminous efficiency and performance of the platinum (II) complex. The O∧C∧N∧N tetradentate platinum (II) complex metal organic material has great application values in organic light-emitting diodes, and is used as a phosphorescent doping material to produce a red light OLED device with high luminous efficiency. Applications of and methods of preparing the O∧C∧N∧N tetradentate platinum (II) complex are described.

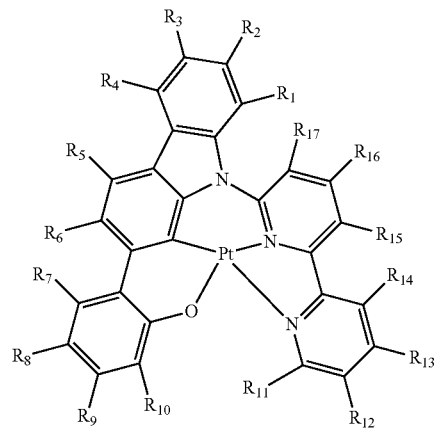

20 Claims, 1 Drawing Sheet

| 70 |
|---|
| 60 |
| 50 |
| 40 |
| 30 |
| 20 |
| 10 |

OCNN-TYPE TETRADENTATE PLATINUM (II) COMPLEX, PREPARATION METHOD THEREFOR, AND APPLICATION THEREOF

TECHNICAL FIELD

The present invention relates to a novel O∧C∧N∧N tetradentate platinum (II) complex metal organic material, and in particular to a phosphorescent doping material having a photon emission effect used in a light-emitting layer of an OLED luminescent device.

BACKGROUND

Organic Light-Emitting Diode (OLED) display technology is the latest display technology and has wide development prospect. Following CRT and LCD, the OLED display technology makes a brilliant appearance; the technology has superior performances of self-luminous property, being free of backlight, high visibility and brightness, wide viewing angle, rapid response, light material weight, thin thickness, and flexible display; meanwhile, the OLED display technology has low voltage demand, less component demand and low cost compared with LCD. The more superior the OLED performance is, the broader the development prospect of being applied in the fields of Smart Phone, television, wearable devices and Virtual Reality (VR) in the future is.

Organic light-emitting phenomenon has been found by the Pope research group as early as 1963; at that time, the Pope research group used two kinds of organic materials to find the light emission of anthracene and tetracene respectively in a Ag/anthracene monocrystal/Ag device and NaCl/anthracene monocrystal-doped tetracene/NaCl device. But since the anthracene monocrystal chip has a thickness of micron order (10-20 μm) and requires to use DC voltage being up to 400 V, weak blue light is observed after applying 400 V voltage to the produced monolayer light-emitting device; and the device has very short service life and is lack of practical application values, which is thus not extensively concerned in the academic circles.

Up to 1987, C. W. Tang, et al. of U.S. KODAK company have taken the evaporation technology to evaporate Diamine (75 nm) as a hole transport layer on an ITO glass with ITO as an anode, and then evaporate a layer of $Alq_3$ (60 nm) as an electron transport layer and a light-emitting layer, and finally evaporate low-work function magnesium and aluminum as a cathode, thus producing the first OLED device with a sandwich structure; high-intensity green light is observed under a voltage of 5 V around; and the brightness is up to 1000 $cd/m^2$; current efficiency is up to 3 cd/A and external quantum efficiency is up to 1%. Such a ground-breaking work has a landmark meaning to innovate a new era of organic photoelectric research, thus pointing out the direction for the organic electroluminescent research.

In the field of OLED materials, doping materials of phosphorescent OLED light-emitting layer have developed comparatively rapidly and maturely, and these materials mainly include organic complexes based on some heavy metals, such as iridium, platinum, europium and osmium. In heavy metal complexes, the presence of heavy metal atoms can produce strong spin-orbital coupling (SOC) such that the triplet exciton whose spinning is hindered originally achieves radiative jump to a ground state $(S_0)$ from the lowest triplet state $(T_1)$, thus producing phosphorescence. Such a method captures triplet exciton and singlet exciton simultaneously, which effectively makes use of triplet exciton incapable of emitting light and breaks the bottleneck of 25% internal quantum efficiency. Therefore, the quantum efficiency can be up to 100% theoretically. This makes the performance of the organic light-emitting phosphorescent device more superior. Therefore, phosphorescent materials are developed and researched in OLED more extensively and intensively. By dispersing into host materials, the phosphorescent metal complex shows a very high external quantum efficiency (EQE); and doped phosphorescent OLEDs reported recently have had an external quantum efficiency greater than 30%.

The OLED technology has been developed for more than 30 years since its development; especially due to the breakthrough in phosphorescent OLED efficiency, the technology shows great prospect in commercial application. In recent years, platinum (II)-based phosphorescent OLED materials have been gradually developed and better research results have been achieved. Due to the property of plane structure, the platinum (II) complex also leads to easy stacking between molecules, easy formation of an excimer and the like, thereby influencing the properties of the OLED device. Generally, large steric hindrance groups, such as tert-butyl are added on molecules to enhance the stereochemical structure of molecules and weaken the molecular interaction.

The development of the OLED display technology is a difficult and significant research; the OLED technology has good properties, and meanwhile also have shortcomings such as, short service life, poor color purity and easy aging, thus limiting its large-scale application. Therefore, to design a novel OLED material with excellent performance, in particular to a light-emitting layer doping material, is the research emphasis and difficulty in the OLED field.

SUMMARY

A novel Pt (II) complex having an O∧C∧N∧N coordination structure based on a carbazole framework is designed in this present invention; the Pt (II) complex emits red light; and an application thereof in organic light emitting diodes is also studied. Carbazole is a kind of electron-rich nitrogenous heterocyclic compound; and the compound has a large π-conjugated rigid planar structure; such kind of unique structure renders the derivatives thereof to show lots of excellent photoelectric properties.

The novel O∧C∧N∧N tetradentate platinum (II) complex metal organic material related in the present invention has a structure as shown in Formula (I) below:

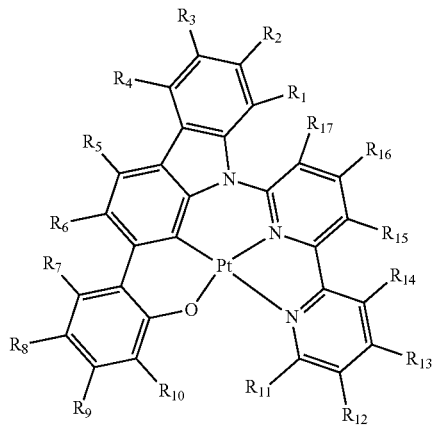

Formula (I)

where $R_1$-$R_{17}$ are independently selected from hydrogen, deuterium, sulfur, halogen, hydroxy, acyl, alkoxy, acyloxy, amino, nitro, acylamino, cyano, carboxyl, styryl, aminocarbonyl, carbamoyl, benzylcarbonyl, aryloxy, silicyl, diarylamino, saturated alkyl containing 1-30 C atoms, unsaturated alkyl containing 1-20 C atoms, substituted or unsubstituted aryl containing 5-30 C atoms, substituted or unsubstituted heteroaryl containing 5-30 C atoms, or adjacent $R_1$-$R_{17}$ are mutually linked to form a ring via a covalent bond; the substitution refers to a substitution by deuterium, halogen, cyano, nitro, amino, C1-C8 alkyl; and heteroatom in the heteroaryl is atoms N, O and S.

Preferably, $R_1$-$R_{17}$ are independently selected from hydrogen, halogen, amino, nitro, cyano, silicyl, diarylamino, saturated alkyl containing 1-10 C atoms, aryl substituted by halogen or one or more C1-C4 alkyl and containing 5-20 C atoms or unsubstituted aryl containing 5-20 C atoms, heteroaryl substituted by halogen or one or more C1-C4 alkyl and containing 5-20 C atoms or unsubstituted heteroaryl containing 5-20 C atoms, or adjacent $R_1$-$R_{16}$ are mutually linked to form a ring via a covalent bond; and the halogen is F, Cl, and Br.

A preferred ligand has a structural formula as shown in Formula (II) below:

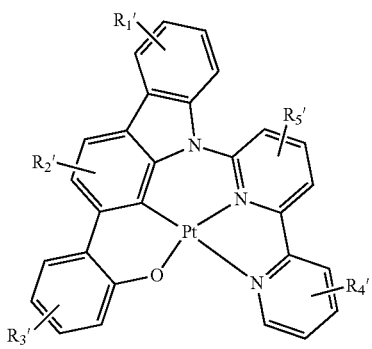

Formula (II)

where, $R_1'$-$R_5'$ are independently selected from hydrogen, halogen, silicyl, diarylamino, saturated alkyl containing 1-10 C atoms, aryl substituted by halogen or one or more C1-C4 alkyl and containing 5-20 C atoms or unsubstituted aryl containing 5-20 C atoms, heteroaryl substituted by halogen or one or more C1-C4 alkyl and containing 5-20 C atoms or unsubstituted heteroaryl containing 5-20 C atoms, or adjacent $R_1'$-$R_5'$ are mutually linked to form a ring via a covalent bond; and the halogen is F, Cl, and Br.

Preferably, in 5 groups of the $R_1'$-$R_5'$, 0-3 groups independently represent diarylamino, aryl substituted by halogen or one to three C1-C4 alkyl and containing 5-10 C atoms or unsubstituted aryl containing 5-10 C atoms, heteroaryl substituted by halogen or one to three C1-C4 alkyl and containing 5-10 C atoms or unsubstituted heteroaryl containing 5-10 C atoms; other groups independently represent hydrogen, halogen or saturated alkyl containing 1-8 C atoms, and the halogen is F and Cl.

Preferably, in the 5 groups of the $R_1'$-$R_5'$, 0-3 groups independently represent diphenylamino, C1-C4 alkyl substituted or unsubstituted phenyl, pyridyl, carbazolyl; and other groups independently represent hydrogen, fluorine or saturated alkyl containing 1-4 C atoms.

A precursor of the above compound, namely, a ligand, has a structural formula as shown in Formula (III) below:

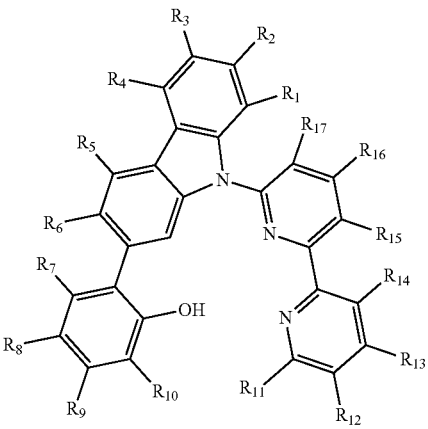

Formula (III)

where $R_1$-$R_{17}$ are independently selected from hydrogen, deuterium, sulfur, halogen, hydroxy, acyl, alkoxy, acyloxy, amino, nitro, acylamino, cyano, carboxyl, styryl, aminocarbonyl, carbamoyl, benzylcarbonyl, aryloxy, silicyl, diarylamino, saturated alkyl containing 1-30 C atoms, unsaturated alkyl containing 1-20 C atoms, substituted or unsubstituted aryl containing 5-30 C atoms, substituted or unsubstituted heteroaryl containing 5-30 C atoms, or adjacent $R_1$-$R_{16}$ are mutually linked to form a ring via a covalent bond; the substitution refers to a substitution by deuterium, halogen, cyano, nitro, amino, C1-C8 alkyl; and heteroatom in the heteroaryl is atoms N, O and S.

A preferred ligand has a structural formula as shown in Formula (IV) below:

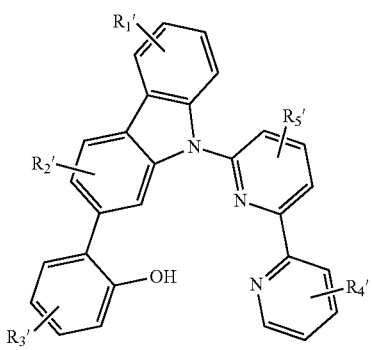

Formula (IV)

where $R_1'$-$R_5'$ are independently selected from hydrogen, halogen, silicyl, diarylamino, saturated alkyl containing 1-10 C atoms, aryl substituted by halogen or one or more C1-C4 alkyl and containing 5-20 C atoms or unsubstituted aryl containing 5-20 C atoms, heteroaryl substituted by halogen or one or more C1-C4 alkyl and containing 5-20 C atoms or unsubstituted heteroaryl containing 5-20 C atoms, or adjacent $R_1'$-$R_5'$ are mutually linked to form a ring via a covalent bond; and the halogen is F, Cl, and Br.

For the purpose of the present application, unless otherwise specified, the terms halogen, alkyl, alkenyl, aryl, acyl, alkoxy and heterocyclic aromatic system or heterocyclic aromatic group may have the following meanings:

the above halogen or halo includes fluorine, chlorine, bromine and iodine, preferably, F, Cl, Br, and particularly preferably F or Cl, and most preferably F.

The above technical features of being linked to form a ring via a covalent bond, aryl and heteroaryl include aryl having 5-30 carbon atoms, preferably, 5-20 carbon atoms, and more preferably 5-10 carbon atoms, and formed by an aromatic ring or more fused aromatic rings. A suitable aryl is, for example, phenyl, naphthyl, acenaphthenyl, acenaphthenyl, anthracyl, fluorenyl, and phenalenyl. The aryl may be unsubstituted (namely, all the substitutable carbon atoms carry hydrogen atoms) or substituted on one, more than one or all the substitutable positions of aryl. A suitable substituent is, for example, halogen, preferably, F, Br or Cl; alkyl, preferably, alkyl having 1-20, 1-10 or 1-8 carbon atoms, particularly preferably, methyl, ethyl, isopropyl or tert-butyl; aryl, preferably, re-substituted or unsubstituted $C_5/C_6$ aryl or fluorenyl; heteroaryl, preferably, heteroaryl having at least one nitrogen atom, particularly preferably, pyridyl; aryl is particularly preferably $C_5/C_6$ aryl which has a substituent selected from F, methyl and tert-butyl, or optionally substituted by at least one of the above substituent; $C_5/C_6$ aryl is particularly preferably $C_5/C_6$ aryl having 0, 1 or 2 of the above substituent, and $C_5/C_6$ aryl is further particularly preferably unsubstituted phenyl or substituted phenyl, such as biphenyl, and phenyl substituted by two tert-butyl in a meta-position.

The unsaturated alkyl having 1-20 carbon atoms, are preferably, alkenyl, more preferably, alkenyl having a double bond, and particularly preferably, alkenyl having a double bond and 1-8 carbon atoms.

The above alkyl includes alkyl having 1-30 carbon atoms, preferably, 1-10 carbon atoms, and more preferably 1-4 carbon atoms. The alkyl may be branched or linear, and also be annular, and may be disconnected by one or more heteroatoms, preferably, N, O or S. Moreover, the alkyl may be substituted by one or more halogens or above aryl-related substituent. Similarly, alkyl may carry one or more aryl; all the above aryl are suitable for the purpose; alkyl is particularly preferably selected from methyl, ethyl, isopropyl, n-propyl, isobutyl, n-butyl, tert-butyl, sec-butyl, isoamyl, cyclopropyl, cyclopentyl and cyclohexyl.

The above acyl is linked to a CO group via a single bond, for example, alkyl used herein.

The above alkoxy is linked to oxygen via a single bond, for example, alkyl used herein.

The above heteroaryl group is understood to be related to aromatic and $C_3$-$C_8$ ring, and further include one oxygen or sulfur atom or 1-4 nitrogen atoms or a combination of one oxygen or sulfur atom with two nitrogen atoms at most, and their substituted as well as benzo- and pyridino-fused derivatives, for example, the aryl group may be substituted by one or more aryl-related substituents mentioned via linking one of ring-forming carbon atoms.

In some embodiments, heteroaryl may be five/six-membered aromatic heterocyclic system carrying the above 0, 1 or 2 substituents independently. Typical examples of heteroaryl include, but are not limited to unsubstituted furan, benzofuran, thiophene, benzothiophene, pyrrole, pyridine, benzpyrole, azole, benzoazole, isazole, benzoisazole, thiazole, benzothiazole, isothiazole, imidazole, benzimidazole, parazole, indazole, tetrazole, quinoline, isoquinoline, pyridazine, pyrimidine, purine and pyrazine, furan, 1,2,3-diazole, 1,2,3-thiadiazole, 1,2,4-thiadiazole, triazole, benzotriazole, pteridine, benzoazole, diazole, benzopyrazole, quinolizine, cinnoline, phthalazine, quinazoline, quinoxaline and mono- or di-substituted derivatives thereof. In some embodiments, substituent is halo, hydroxy, cyano, O-$C_{1-6}$ alkyl, $C_{1-6}$ alkyl, hydroxy $C_{1-6}$ alkyl and amino-$C_{1-6}$ alkyl.

Specific detailed examples as shown below include, but not limited to the following structures:

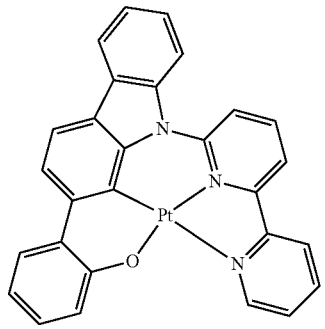

TM-1

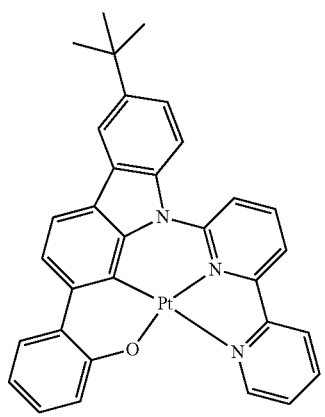

TM-2

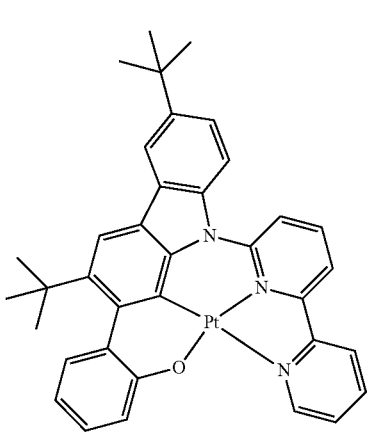

TM-3

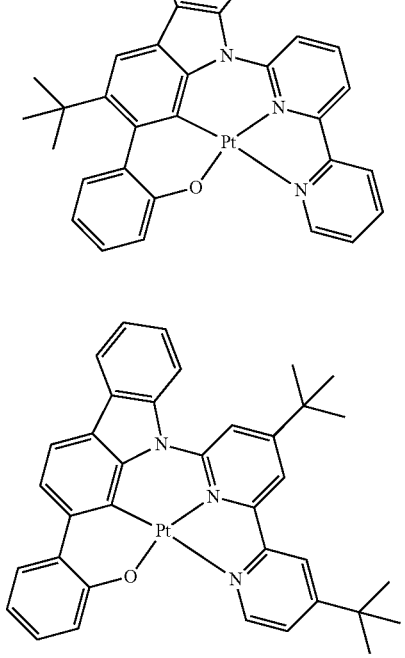

TM-4

TM-5
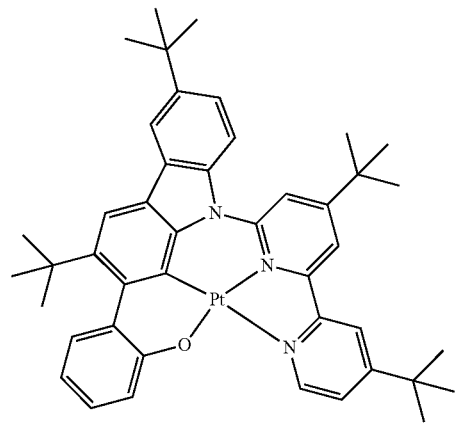
TM-6
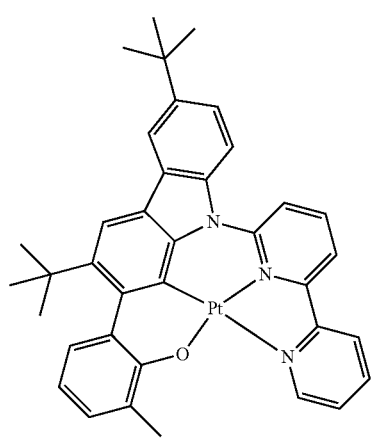
TM-7
TM-8
TM-9
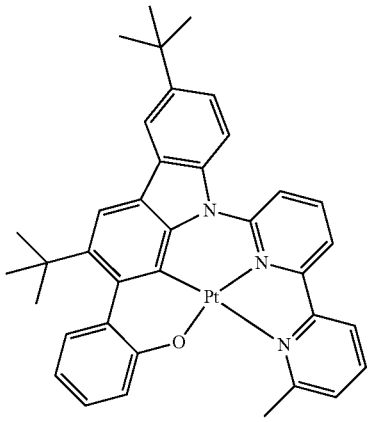
TM-10
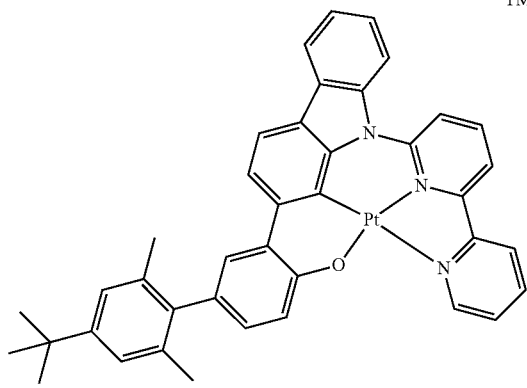
TM-11
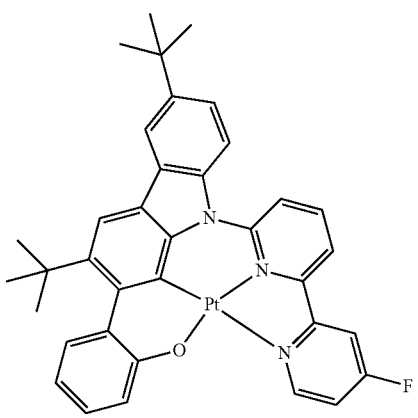
TM-12
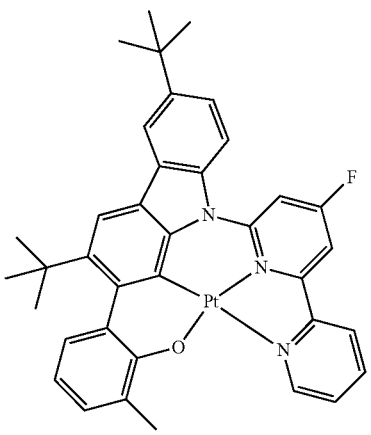

TM-13
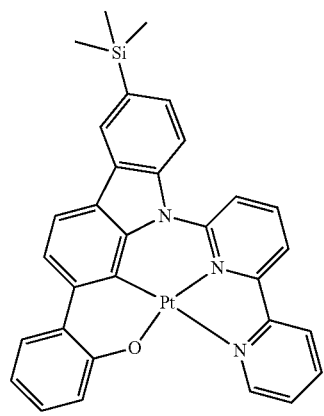
TM-14
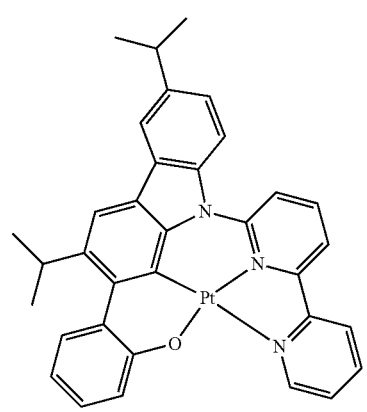
TM-15
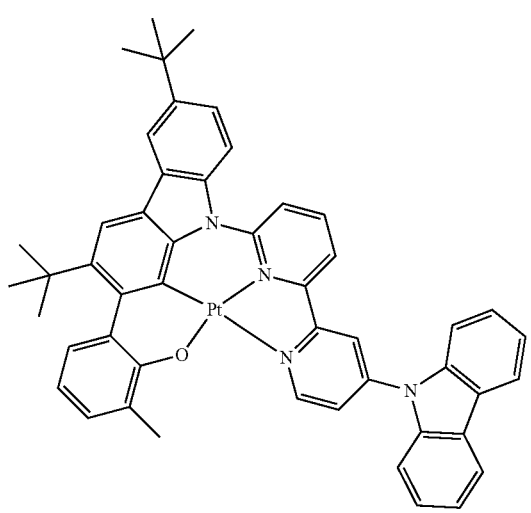
TM-16
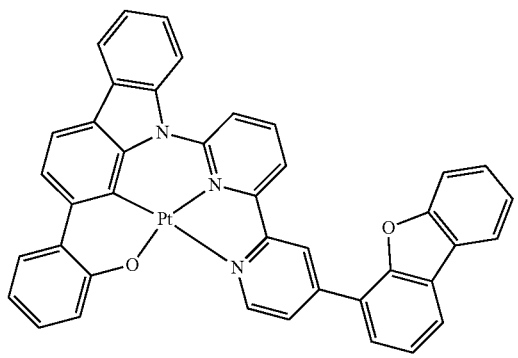
TM-17
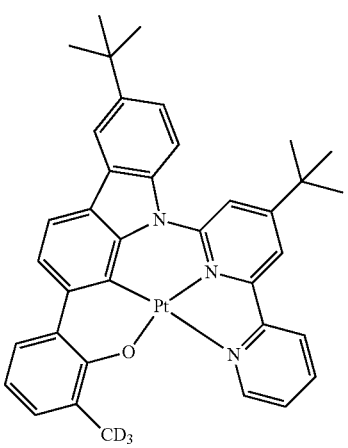
TM-18
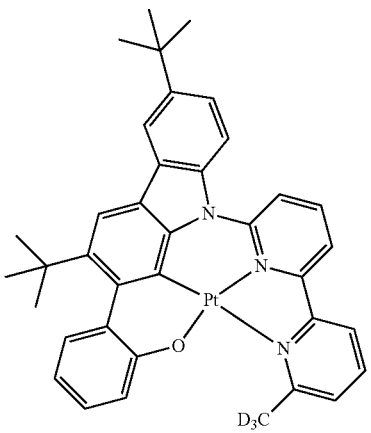
TM-19
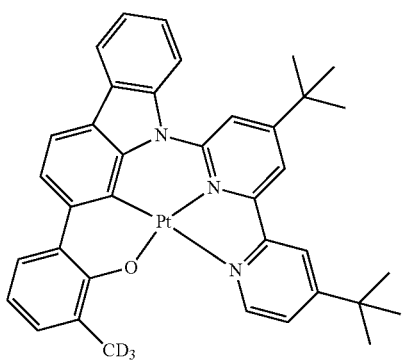

TM-20
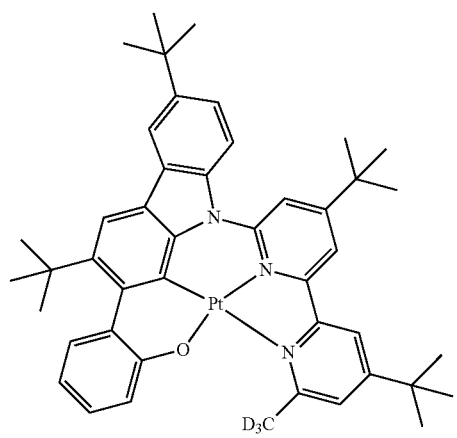
TM-21
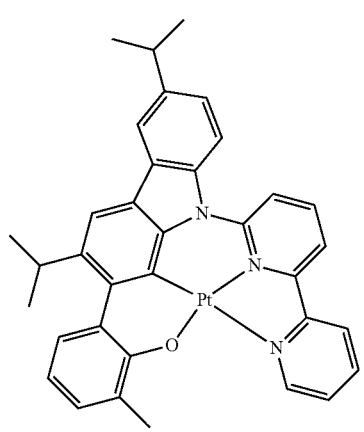
TM-22
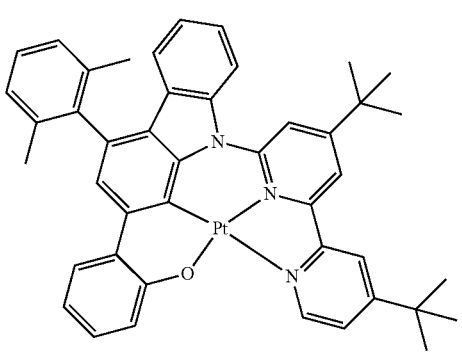
TM-23
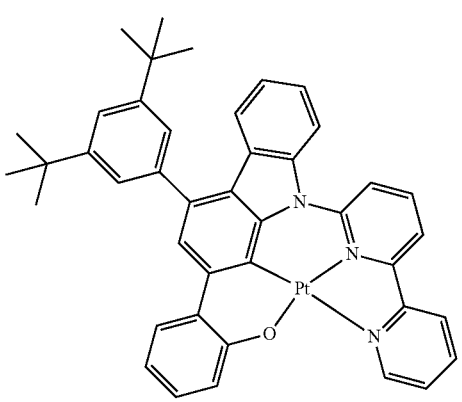
TM-24
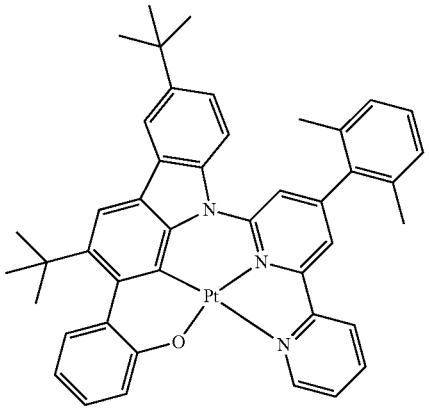
TM-25
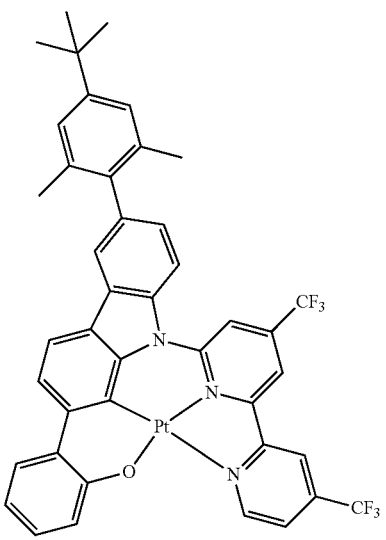
TM-26
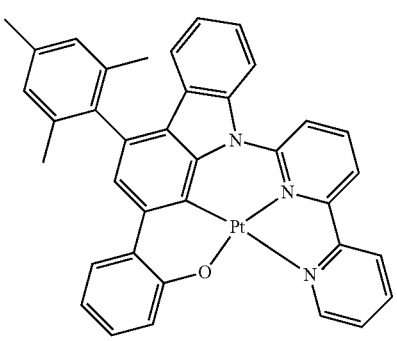

-continued

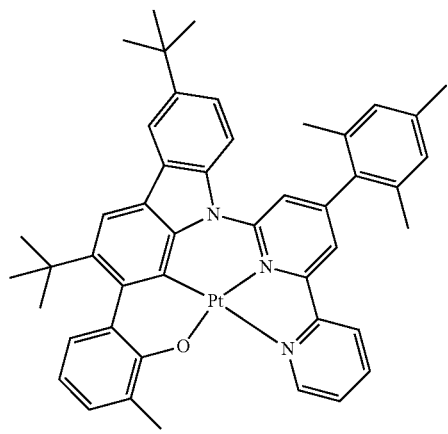
TM-27

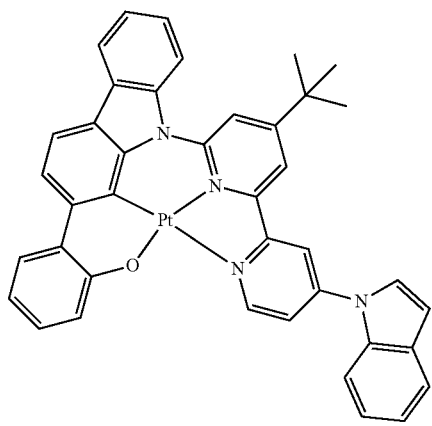
TM-28

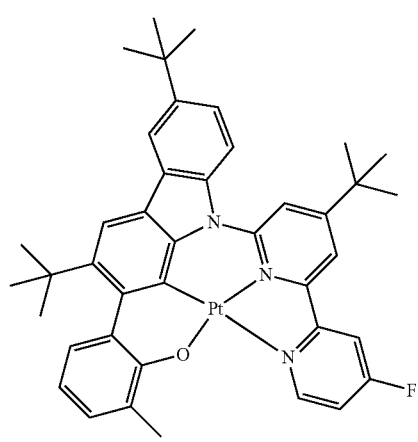
TM-29

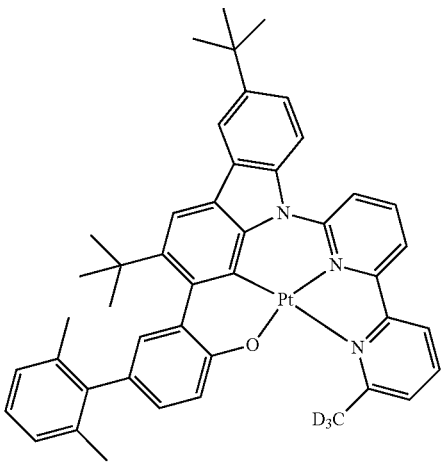
TM-30

Provided is an application of the above complex in an OLED luminescent device.

The platinum (II) complex having the above structure may be used for the manufacture of an OLED device for heat deposition and solution treatment.

The present invention includes an organic light-emitting device containing one or more of the above complexes.

The complex is applied in the device by heat deposition in a form of layer.

The complex is applied in the device by spin coating in a form of layer.

The complex is applied in the device by ink-jet printing in a form of layer.

The above organic light-emitting device emits orange red light when an electric current is applied.

The organic metal complex of the present invention has a high fluorescence quantum efficiency, good heat stability and a low quenching constant, and can be used for the manufacture of a red light OLED device with high luminous efficiency and low roll-off property.

BRIEF DESCRIPTION OF DRAWINGS

FIG. 1 is a structure diagram showing an organic light-emitting device of the present invention.

DETAILED DESCRIPTION OF EMBODIMENTS

The present invention will be further described specifically in combination with the examples below.

The preparation method of the above complex includes the following steps:

as shown below, subjecting carbazole derivatives S1 and S2 to Suzuki reaction to obtain a substrate S3; subjecting the S3 and S4 to Buchwald reaction to obtain an S5; demethylating the S5 under the action of a pyridine hydrochloride to obtain a ligand S6, and reacting the S6 with $K_2PtCl_4$ to obtain a target product P.

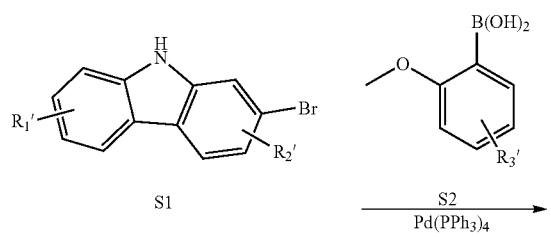
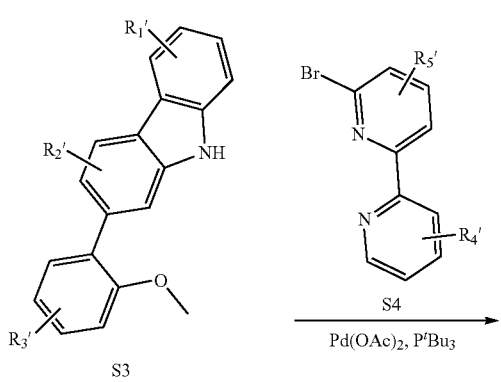
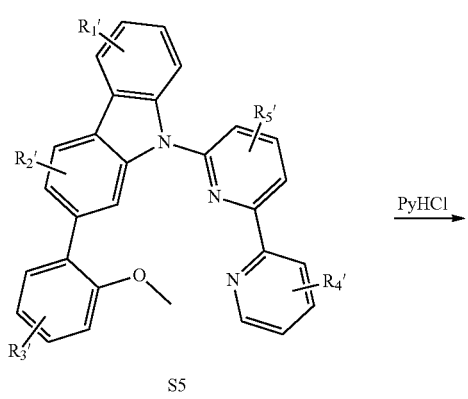
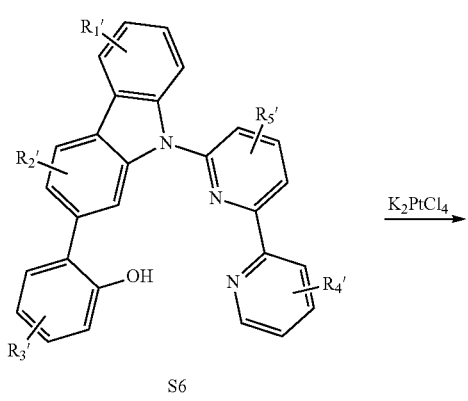
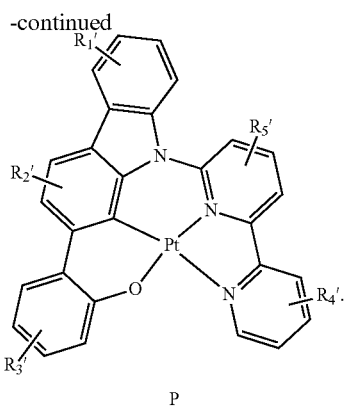
P
The present invention will be further described specifically in combination with the examples below.
Initial substrates and solvents related in the compound synthesis of the present invention are purchased from Energy Chemical, J&K Chemicals, aladdin and other suppliers known well by a person skilled in the art.
Example 1:
TM-1
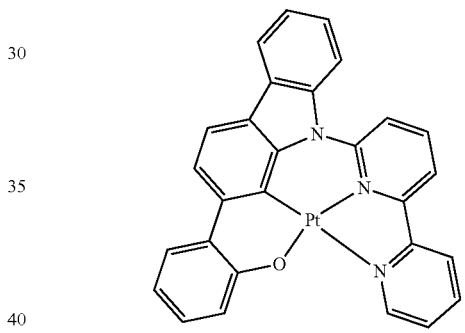
Synthesis route:
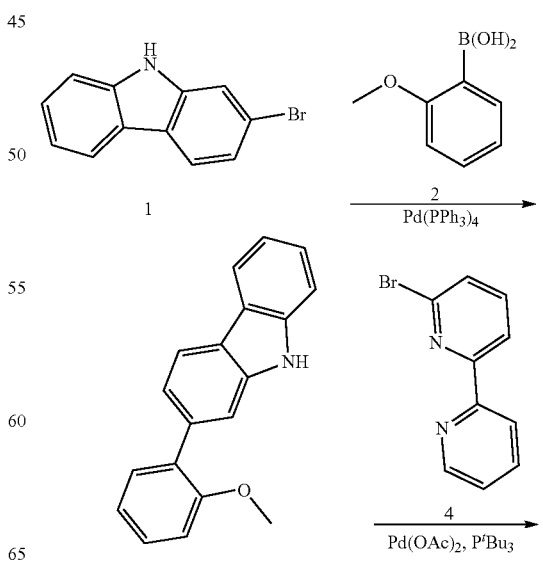

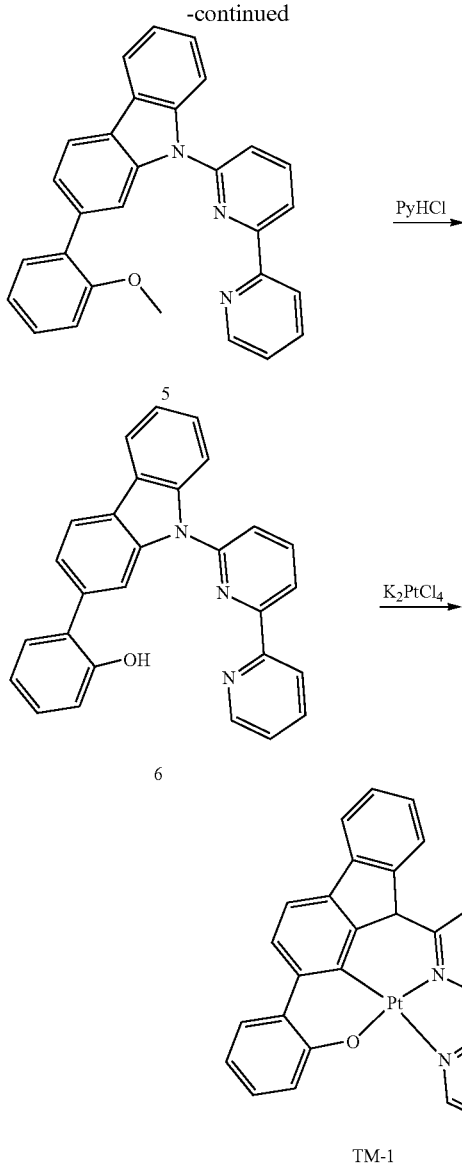

Synthesis of the compound 3: 9.84 g (40.0 mmol) compound 1, 6.69 g (1.1 eq., 44.0 mmol) compound 2, 11.04 g (2.0 eq., 80 mmol) potassium carbonate and 924 mg (0.02 eq., 0.8 mmol) Pd(PPh$_3$)$_4$ were taken and added to a three-necked flask, vacuumized and fed with nitrogen for replacement repeatedly, then infused with 120 mL dioxane and 40 mL water, and heated up to 105° C. The system was subjected to reaction for 12 h under the protection of nitrogen, then cooled to room temperature; a proper amount of water and ethyl acetate were added for extraction, organic phases were collected and dried by anhydrous magnesium sulfate, after removing the solvent by rotary evaporation, a n-hexane/ethyl acetate system column chromatography (mobile phase n-hexane/ethyl acetate=10:1) was performed, thus obtaining 10.0 g of a white solid with a yield of 92% and a purity of 99.5%. Theoretical values of mass spectrometry (ESI$^+$) ([M–H]$^-$) C$_{19}$H$_{14}$NO:272.11; measured value: 272.13.

Synthesis of the compound 5:5.47 g (20 mmol) compound 3, 5.17 g (1.1 eq., 22 mmol) compound 4, 225 g (0.02 eq., 1 mmol) palladium acetate, 0.20 g (0.04 eq., 2 mmol) tri-tert-butylphosphine, and 4.5 g (2.0 eq., 0.04 mol) potassium tert-butoxide were taken and added to a flask, and added with 100 mL toluene, and heated for reflux reaction for 8 h under the protection of nitrogen. After stopping the reaction, the system was cooled to room temperature and subjected to rotary evaporation to remove the solvent; a proper amount of water and ethyl acetate were added for extraction, organic phases were collected and dried, after removing the solvent by rotary evaporation, a flash silica gel column (mobile phase n-hexane/ethyl acetate=10:1) was used for separation, thus obtaining 7.3 g of a target product compound 5 with a yield of 85% and a purity of 99.9%. Theoretical values of mass spectrometry (ESI$^-$)([M–H]$^-$) C$_{29}$H$_{21}$N$_3$O:426.16; measured value: 426.13.

Synthesis of the compound 6:4.27 g (10 mmol) compound 5 and 50 g pyridine hydrochloride were taken and heated up to 200° C. for reaction for 8 h under the protection of nitrogen. After stopping the reaction, a proper amount of water and ethyl acetate were added for extraction, organic phases were collected and dried, after removing the solvent by rotary evaporation, a flash silica gel column (mobile phase n-hexane/ethyl acetate=15:1) was used for separation and methanol was used for recrystallization, thus obtaining 63.3 g of a target product compound 6 with a yield of 80% and a purity of 99.9%.Theoretical values of mass spectrometry (ESI$^-$)([M–H]$^-$) C$_{28}$H$_{18}$N$_3$O:412.15; measured value: 412.10.

Synthesis of the compound TM-1: 2.06 g (5.0 mmol) compound 6, 400 mg (0.25 eq., 1.25 mmol) tetrabutylammonium bromide and 2.49 mg (1.2 eq., 6 mmol) potassium tetrachlorplatinate were taken and dissolved into 150 mL acetic acid, and vacuumized and fed nitrogen for replacement for several times, stirred and heated up to 130° C. for reaction for 12 h. After stopping the reaction, the system was cooled to remove the solvent by rotary evaporation; a proper amount of water and ethyl acetate were added for extraction, organic phases were collected and dried by anhydrous magnesium sulfate, then subjected to rotary evaporation to remove the solvent, and a n-hexane/ethyl acetate system column chromatography was performed, and the obtained coarse product was sublimated in vacuum, thus obtaining 1.67 g of a red solid with a total yield of 55% and a purity of 99.9%. Theoretical values of mass spectrometry (ESI$^+$) ([M+H]$^+$) C$_{28}$H$_{18}$N$_3$OPt:607.10; measured value: 607.15.

Example 2:

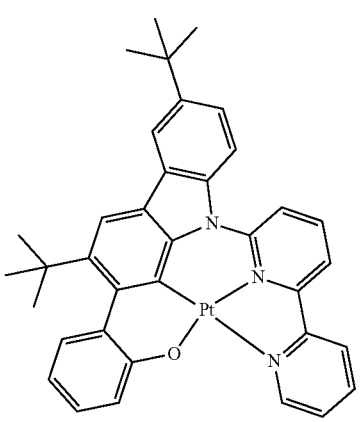

The preparation method of TM-3 is the same as the synthetic route of TM-1, and the only difference is that the compound 1 is replaced with the compound 7. The compound 7 has the following molecular formula:

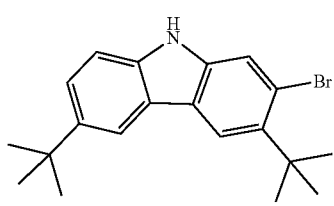
(Compound 7)

Example 3:

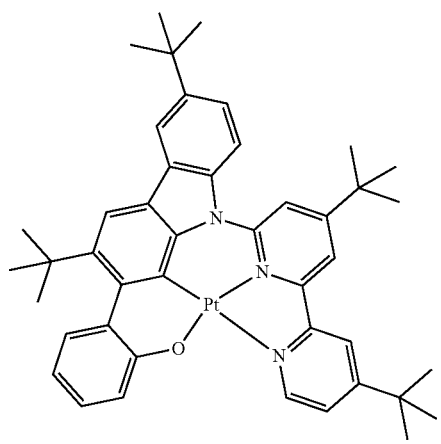
TM-5

The preparation method of TM-5 is the same as the synthetic route of TM-1, and the only difference is that the compound 1 is replaced with the compound 7, and the compound 4 is replaced with the compound 8. The compound 8 has the following molecular formula:

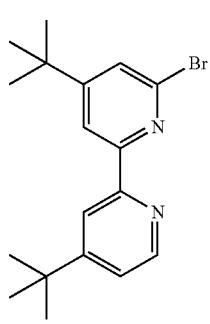
(Compound 8)

The application example of the compound in the present invention is as follows:

ITO/TAPC (60 nm)/TCTA:Pt(II)(40 nm)/TmPyPb(30 nm)/LiF(1 nm)/Al (80 nm)

Preparation mode of the device:

A transparent anode, indium tin oxide (ITO, 20)(10Ω/sq) glass substrate was subjected to ultrasonic cleaning with acetone, ethanol and distilled water successively, and then subjected to plasma treatment with oxygen gas for 5 min.

The ITO substrate was then mounted on a substrate holder of a vacuum gas-phase evaporation equipment. In the evaporation equipment, the system pressure was controlled $10^{-6}$ torr.

Afterwards, a hole transport layer (30) material TAPC having a thickness of 60 nm was evaporated on the ITO substrate.

A light-emitting layer material (40) TCTA having a thickness of 40 nm was then evaporated, where the platinum (II) complex having a mass fraction of 10% was doped.

A hole transport layer (50) material TmPyPb having a thickness of 30 nm was then evaporated.

LiF having a thickness of 1 nm was then evaporated as an electron injection layer (60).

Finally, Al having a thickness of 80 nm was evaporated as a cathode (70) and device packaging was completed. As shown below:

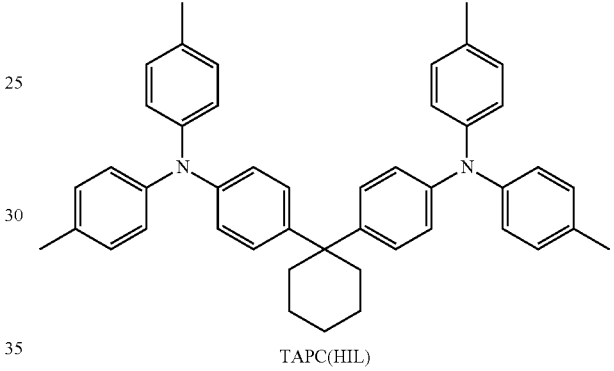
TAPC(HIL)

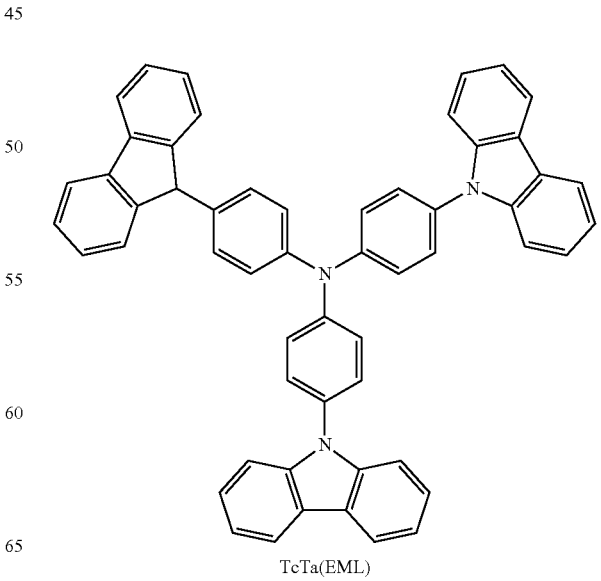
TcTa(EML)

-continued

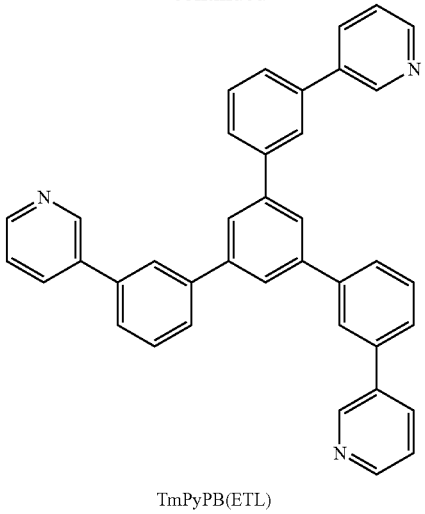

TmPyPB(ETL)

The device structure and manufacture method are basically completely the same; the difference lies in doping concentration and lies that organometallic complexes P0, P1, P2, P3 and P4 successively serve as dopants in the light-emitting layer. STD is an O/\N/\N/\O red emitting material.

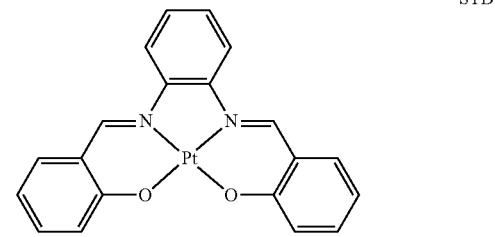

STD

The devices STD, 1, 2, and 3 are successively prepared; the device structure and manufacture method are basically completely the same; the difference is that the platinum (II) complexes STD, TM-1, TM-3, and TM-5 successively serve as dopants in the light-emitting layer. The reference material STD is a typical red emitting material having an ONCN coordination structure.

Comparison results of the devices are shown in Table 1. With the performance of the device STD as standards, – represents holding the standard line; – – represents reduction by 5% above relative to the standard performance; + represents promotion by 5% relative to the standard performance; ++ represents promotion by 10% relative to the standard performance.

|  | Device 1 | Device 2 | Device 3 |
| --- | --- | --- | --- |
| Maximum external quantum efficiency | – | + | ++ |
| External quantum efficiency below 100 nit | + | + | ++ |
| Turn-on voltage | – | – | – |
| Current efficiency below 100 nit | + | + | ++ |

Relative to the STD-based reference device, the TM-1-based device 1 basically has the same maximum external quantum efficiency and turn-on voltage, improved external quantum efficiency below 100 nit and current efficiency by 5% around; from the aspect of molecular structure, TM-1 and STD have a consistent plane structure, but TM-1 has a larger conjugated structure such that the device performance is improved to some extent relative to that of the STD. Relative to the reference device, the TM-3-based device 2 basically has the same turn-on voltage, and has improved maximum external quantum efficiency, external quantum efficiency below 100 nit and current efficiency by 5% around. From the aspect of molecular structure, 2 tert-butyl are brought in the TM-3 molecular structure to reduce the intermolecular aggregation and stacking to some extent, thus being beneficial to the performance improvement of device. Relative to the reference device, the TM-5-based device 3 basically has the same turn-on voltage, and has improved maximum external quantum efficiency, external quantum efficiency below 100 nit and current efficiency by 10% around. From the aspect of molecular structure, 4 tert-butyl are brought in the TM-3 molecular structure to greatly enhance the tridimensional property of molecules, greatly reduce the intermolecular interaction, and meanwhile to keep the rigid structure and large conjugate properties of the molecular skeleton. Therefore, the device has maximum efficiency promotion and optimal performance.

To sum up, relative to the reference device, the organic light-emitting device prepared by the present invention has better improvement in performance, obviously enhanced external quantum efficiency or current efficiency; and the related novel O/\C/\N/\N tetradentate platinum (II) complex metal organic material has greater application values. The tetradentate platinum (II) complex involved in the present invention is based on a carbazole framework, and has a large π-conjugated rigid planar structure, which can greatly reduce non-radiative energy dissipation such as intramolecular rotation and vibration, and is conducive to improving the luminous efficiency and performance of the platinum (II) complex. The O/\C/\N/\N tetradentate platinum (II) complex metal organic material prepared by the present invention has great application values in organic light-emitting diodes, and is used as a phosphorescent doping material to produce a red light OLED device with high luminous efficiency.

The invention claimed is:
1. An O/\C/\N/\N tetradentate platinum (II) complex, having a structure as shown in Formula (I):

Formula (I)

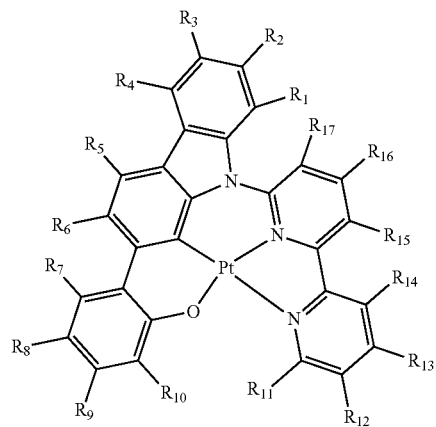

wherein:
R$_1$-R$_{17}$ are independently selected from hydrogen, deuterium, sulfur, halogen, hydroxy, acyl, alkoxy, acyloxy, amino, nitro, acylamino, cyano, carboxyl, styryl, aminocarbonyl, carbamoyl, benzylcarbonyl, aryloxy, silicyl, diarylamino, saturated alkyl containing 1-30 C atoms, substituted or unsubstituted aryl containing 5-30 C atoms, and substituted or unsubstituted heteroaryl containing 5-30 C atoms;
the substitution refers to a substitution by deuterium, halogen, cyano, nitro, amino, C1-C8 alkyl; and
heteroatom in the heteroaryl is atoms N, O and S; or
wherein:
adjacent R$_1$-R$_{17}$ are mutually linked to form a ring via a covalent bond.

2. The complex according to claim 1,
wherein:
the R$_1$-R$_{17}$ are independently selected from:
hydrogen,
halogen, the halogen being at least one or F, Cl, and Br,
amino,
nitro,
cyano,
silicyl,
diarylamino,
saturated alkyl containing 1-10 C atoms,
aryl substituted by halogen or one or more C1-C4 alkyl and containing 5-20 C atoms or unsubstituted aryl containing 5-20 C atoms, and
heteroaryl substituted by halogen or one or more C1-C4 alkyl and containing 5-20 C atoms or unsubstituted heteroaryl containing 5-20 C atoms, or
wherein:
adjacent R$_1$-R$_{17}$ are mutually linked to form a ring via a covalent bond.

3. The complex according to claim 2, having a structure as shown in Formula (II):

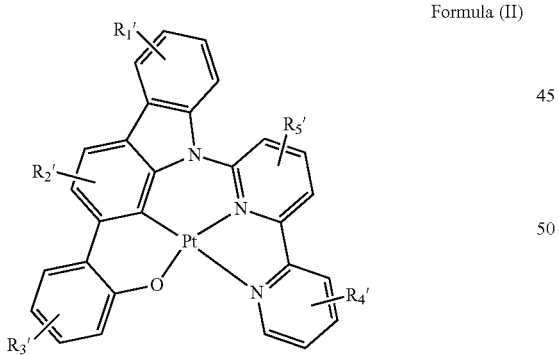

Formula (II)

wherein:
R$_1$'-R$_5$' are independently selected from:
hydrogen,
halogen, the halogen being at least one of F, Cl, and Br,
silicyl,
diarylamino,
saturated alkyl containing 1-10 C atoms,
aryl substituted by halogen or one or more C1-C4 alkyl and containing 5-20 C atoms or unsubstituted aryl containing 5-20 C atoms, and
heteroaryl substituted by halogen or one or more C1-C4 alkyl and containing 5-20 C atoms or unsubstituted heteroaryl containing 5-20 C atoms, or
wherein:
adjacent R$_1$'-R$_5$' are mutually linked to form a ring via a covalent bond.

4. The complex according to claim 3, wherein:
in five groups of the R$_1$'-R$_5$', zero to three groups independently represent diarylamino, aryl substituted by halogen or one to three C1-C4 alkyl and containing 5-10 C atoms or unsubstituted aryl containing 5-10 C atoms, heteroaryl substituted by halogen or one to three C1-C4 alkyl and containing 5-10 C atoms or unsubstituted heteroaryl containing 5-10 C atoms; and
other groups independently represent hydrogen, halogen or saturated alkyl containing 1-8 C atoms, and the halogen is F and Cl.

5. The complex according to claim 4, wherein:
in the five groups of the R$_1$'-R$_5$', zero to three groups independently represent diarylamino, C1-C4 alkyl substituted or unsubstituted phenyl, pyridyl, and carbazolyl; and
other groups independently represent hydrogen, fluorine and saturated alkyl containing 1-4 C atoms.

6. The complex according to claim 1, having one of the following structures:

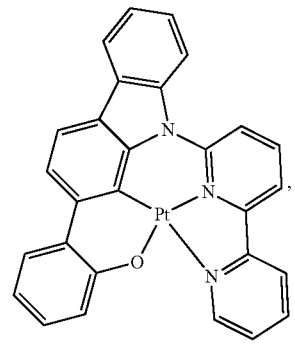

TM-1

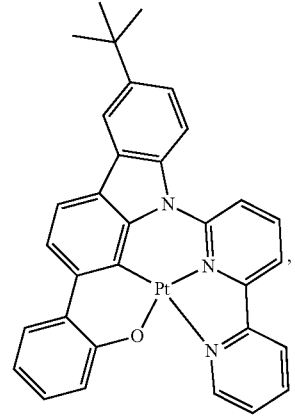

TM-2

TM-3
TM-4
TM-5
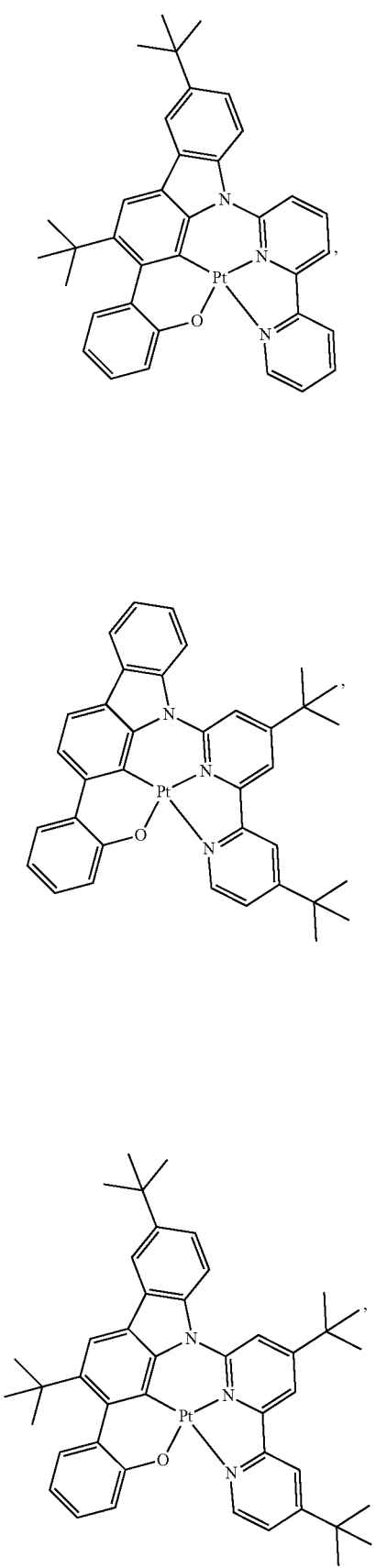
TM-6
TM-7
TM-8
TM-9
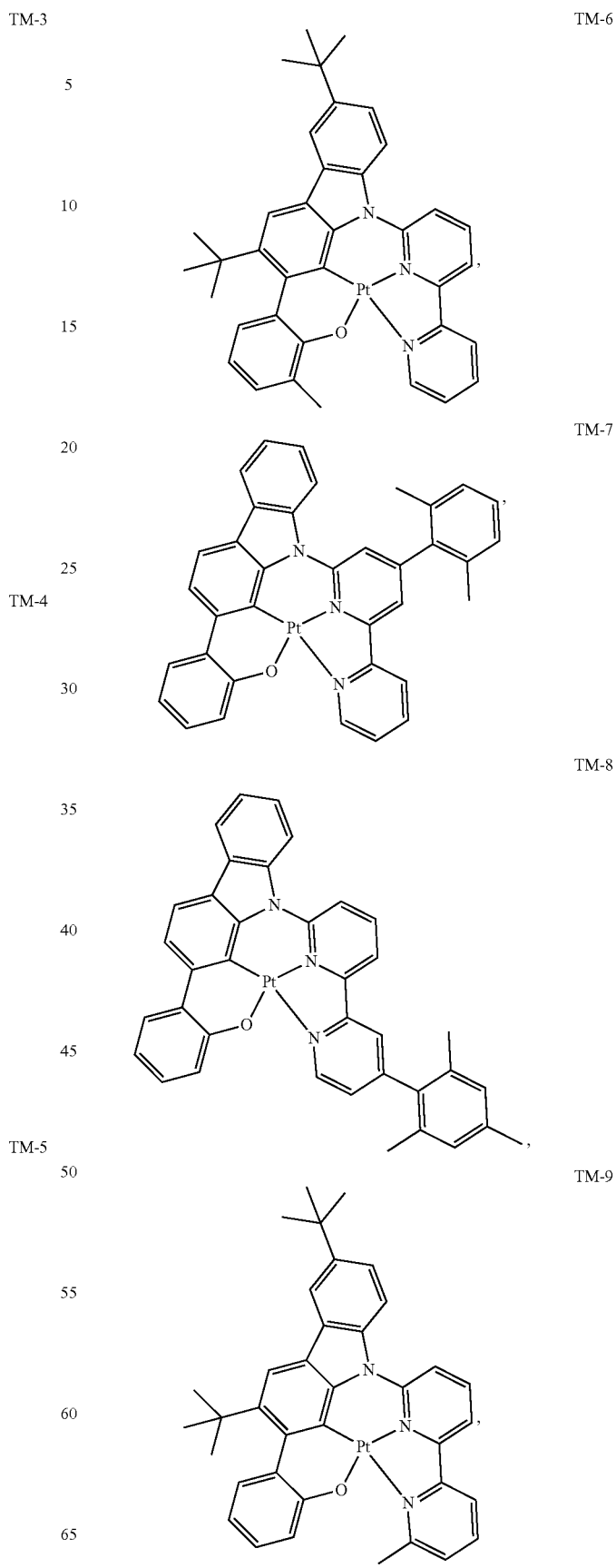

TM-10
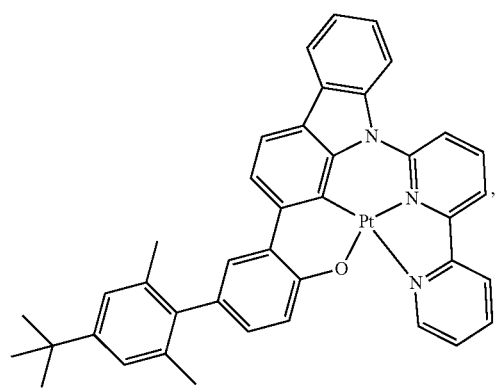
TM-13
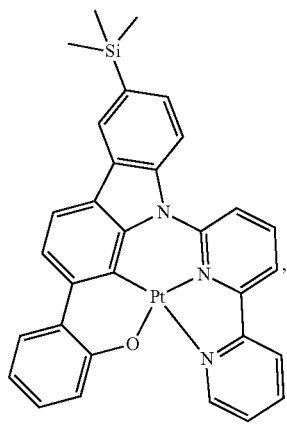
TM-11
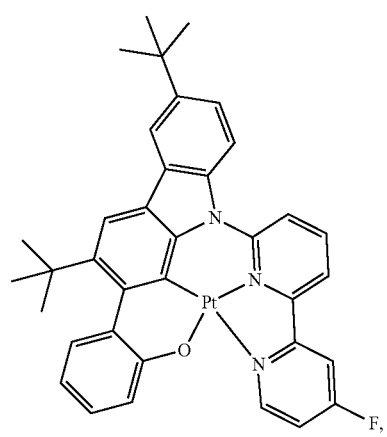
TM-14
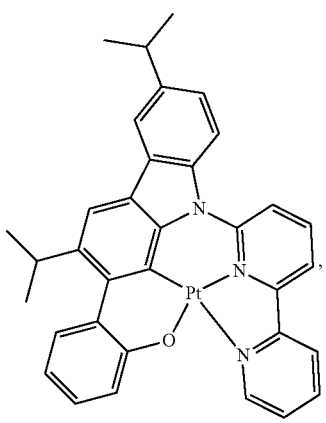
TM-12
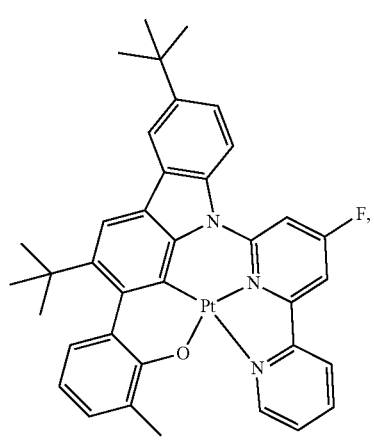
TM-15
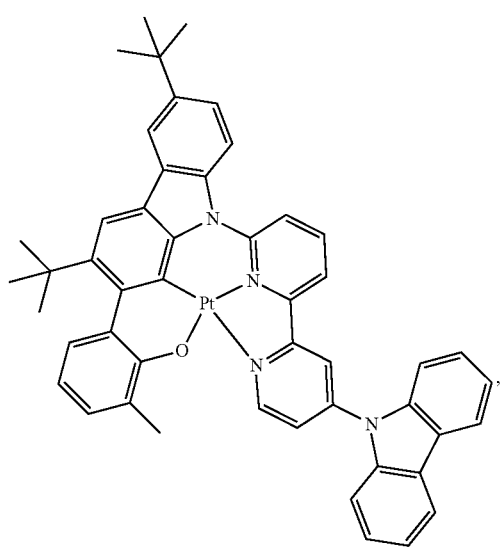

TM-16
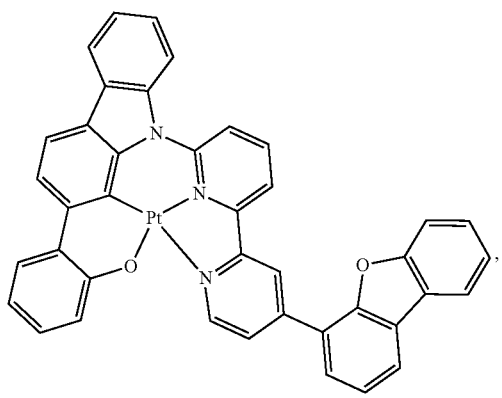
TM-17
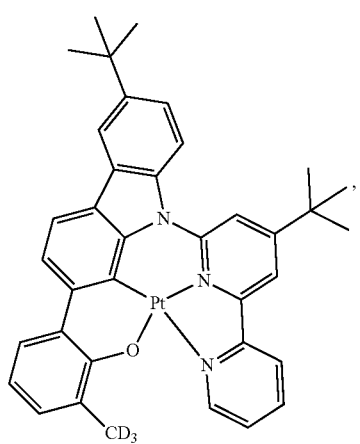
TM-18
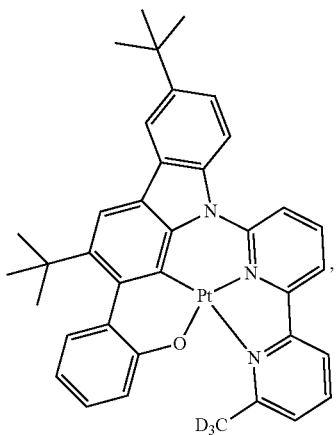
TM-19
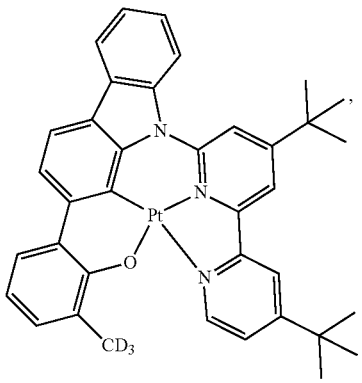
TM-20
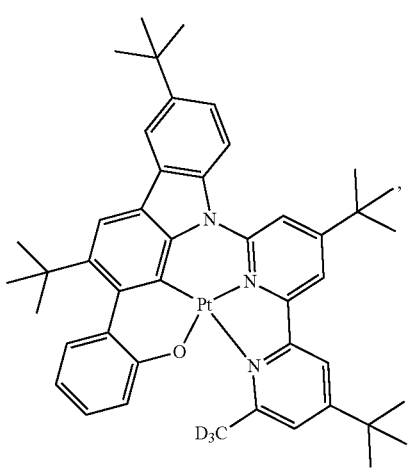
TM-21
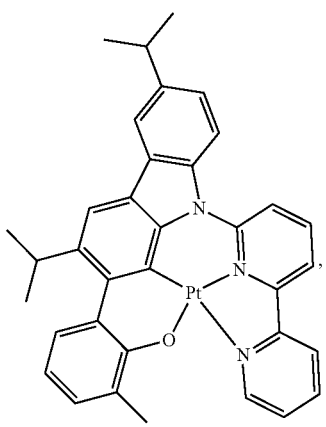

TM-22
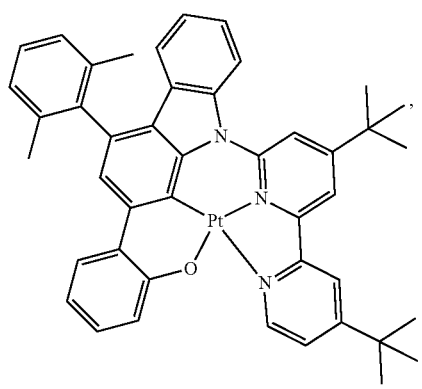
TM-23
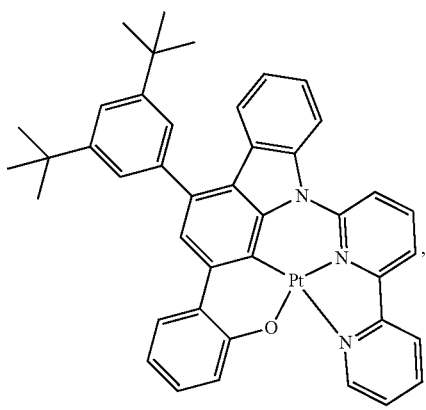
TM-24
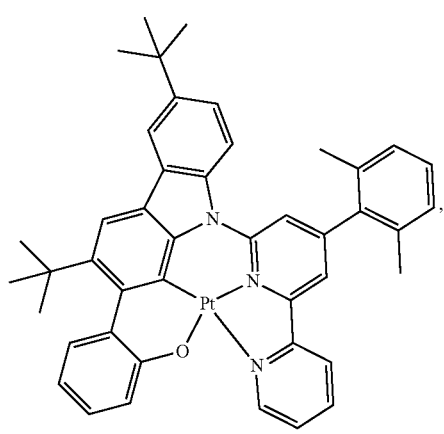
TM-25
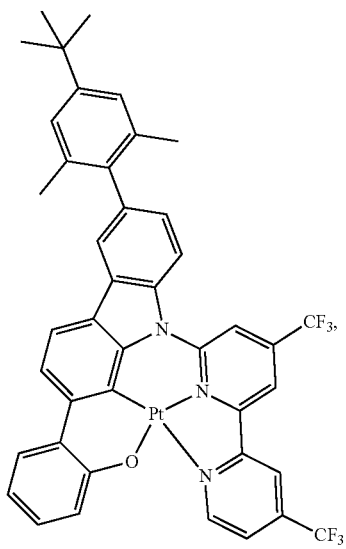
TM-26
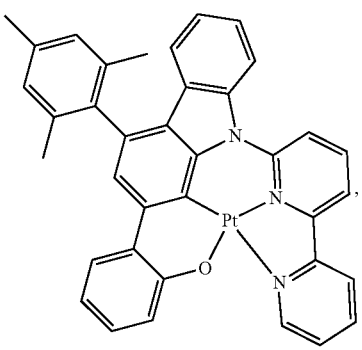
TM-27
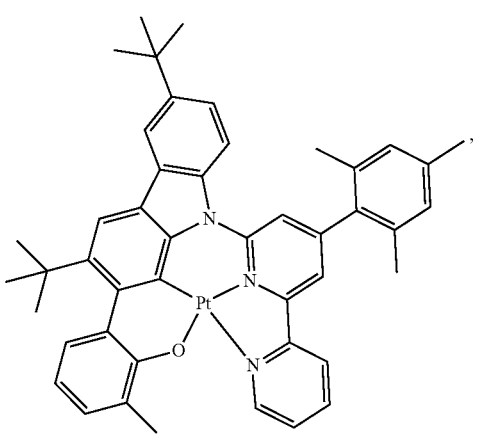

Formula (III)

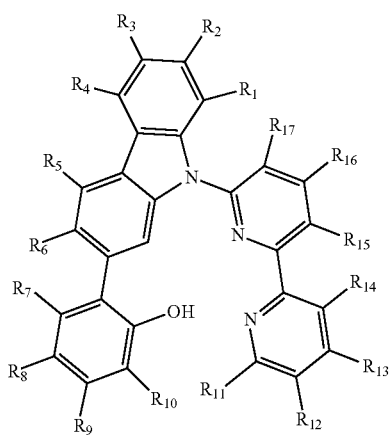

7. A precursor of the complex of claim 1, having a structural formula as shown in Formula (III):

Formula (III)

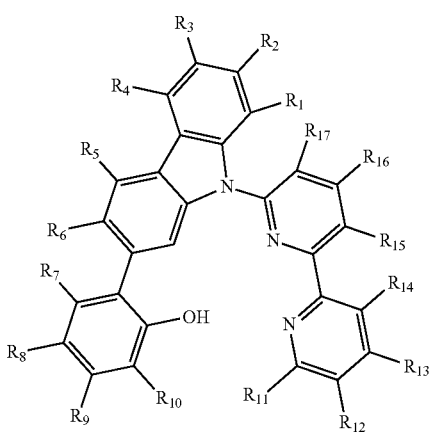

wherein:

R$_1$-R$_{17}$ are independently selected from hydrogen, deuterium, sulfur, halogen, hydroxy, acyl, alkoxy, acyloxy, amino, nitro, acylamino, cyano, carboxyl, styryl, aminocarbonyl, carbamoyl, benzylcarbonyl, aryloxy, silicyl, diarylamino, saturated alkyl containing 1-30 C atoms, substituted or unsubstituted aryl containing 5-30 C atoms, and substituted or unsubstituted heteroaryl containing 5-30 C atoms;

the substitution refers to a substitution by deuterium, halogen, cyano, nitro, amino, C1-C8 alkyl; and heteroatom in the heteroaryl is atoms N, O and S; or wherein:

adjacent R$_1$-R$_{17}$ are mutually linked to form a ring via a covalent bond.

8. The precursor according to claim 7, having a structural formula as shown in Formula (IV):

Formula (IV)

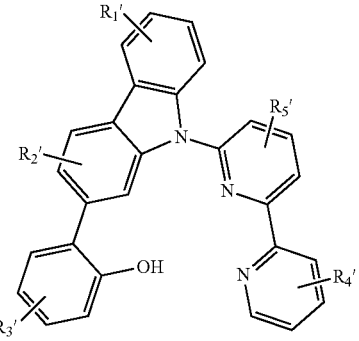

wherein:

R$_1$'-R$_5$' are independently selected from:

hydrogen, halogen, the halogen being at least one of F, Cl, and Br, silicyl, diarylamino, saturated alkyl containing 1-10 C atoms, aryl substituted by halogen or one or more C1-C4 alkyl and containing 5-20 C atoms or unsubstituted aryl containing 5-20 C atoms, heteroaryl substituted by halogen or one or more C1-C4 alkyl and containing 5-20 C atoms or unsubstituted heteroaryl containing 5-20 C atoms, or wherein:

adjacent R$_1$'-R$_5$' are mutually linked to form a ring via a covalent bond.

9. A synthesis method of the complex according to claim 3, comprising:

subjecting carbazole derivatives S1 and S2 to Suzuki reaction to obtain a substrate S3;

subjecting the S3 and S4 to Buchwald reaction to obtain an S5;

demethylating the S5 under the action of a pyridine hydrochloride to obtain a ligand S6; and reacting the S6 with K$_2$PtCl$_4$ to obtain a target product P, wherein a reaction formula thereof is as follows:

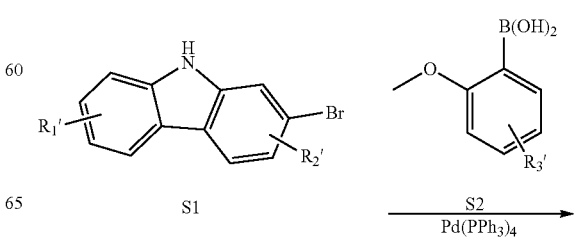

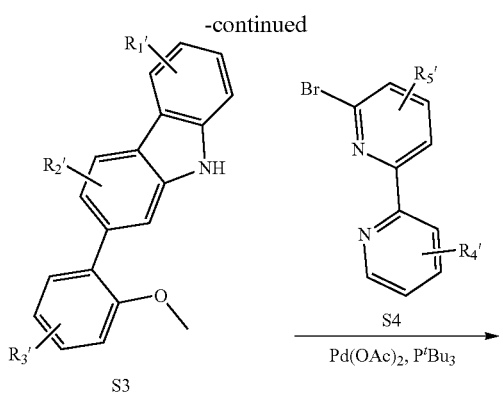

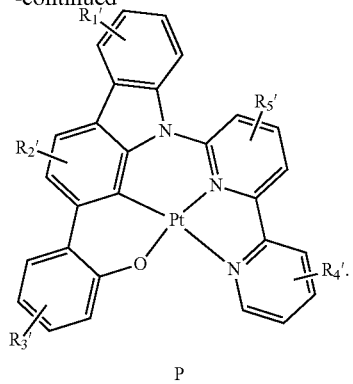

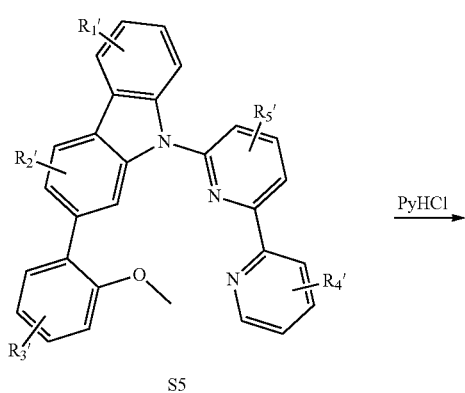

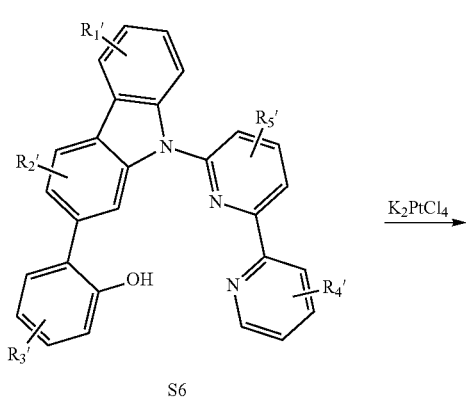

10. An application of the complex of claim 1 in an OLED luminescent device.

11. The application according to claim 10, wherein the complex is applied to the OLED luminescent device by heat deposition, spin coating and ink-jet printing in a form of layer.

12. The application according to claim 10, wherein the complex serves as a phosphorescent doping material having a photon emission effect in a light-emitting layer.

13. An application of the complex of claim 2 in an OLED luminescent device.

14. The application according to claim 13, wherein the complex is applied to the OLED luminescent device by heat deposition, spin coating and ink-jet printing in a form of layer.

15. An application of the complex of claim 3 in an OLED luminescent device.

16. The application according to claim 15, wherein the complex is applied to the OLED luminescent device by heat deposition, spin coating and ink-jet printing in a form of layer.

17. An application of the complex of claim 4 in an OLED luminescent device.

18. The application according to claim 17, wherein the complex is applied to the OLED luminescent device by heat deposition, spin coating and ink-jet printing in a form of layer.

19. An application of the complex of claim 5 in an OLED luminescent device.

20. An application of the complex of claim 6 in an OLED luminescent device.

* * * * *